(12) United States Patent
Corhodzic et al.

(10) Patent No.: US 8,994,231 B1
(45) Date of Patent: Mar. 31, 2015

(54) MEDIUM VOLTAGE POWER DISTRIBUTION

(75) Inventors: Selver Corhodzic, Campbell, CA (US); Jimmy Clidaras, Los Altos, CA (US)

(73) Assignee: Exaflop LLC, Mountain View, CA (US)

( * ) Notice: Subject to any disclaimer, the term of this patent is extended or adjusted under 35 U.S.C. 154(b) by 1116 days.

(21) Appl. No.: 12/959,662

(22) Filed: Dec. 3, 2010

(51) Int. Cl.
*H01B 7/30* (2006.01)
*H01F 27/40* (2006.01)

(52) U.S. Cl.
CPC ................................... *H01F 27/40* (2013.01)
USPC .......................................................... 307/147

(58) Field of Classification Search
USPC .......................................................... 307/147
See application file for complete search history.

(56) References Cited

U.S. PATENT DOCUMENTS

| | | | |
|---|---|---|---|
| 7,492,057 B2 * | 2/2009 | Baldwin et al. ................ | 307/64 |
| 7,560,831 B2 * | 7/2009 | Whitted et al. ................ | 307/64 |
| 7,851,950 B1 * | 12/2010 | Morales ........................ | 307/147 |
| 8,378,530 B1 * | 2/2013 | Morales ........................ | 307/147 |
| 8,588,989 B1 * | 11/2013 | Heath et al. ................... | 700/295 |
| 8,624,433 B2 * | 1/2014 | Whitted et al. ................ | 307/66 |
| 8,638,008 B2 * | 1/2014 | Baldwin et al. ............... | 307/64 |
| 2007/0046103 A1 * | 3/2007 | Belady et al. ................. | 307/12 |
| 2007/0278860 A1 * | 12/2007 | Krieger et al. ................ | 307/64 |
| 2012/0007430 A1 * | 1/2012 | Humphrey et al. ........... | 307/80 |
| 2012/0056481 A1 * | 3/2012 | Corhodzic et al. ............ | 307/66 |
| 2012/0140415 A1 * | 6/2012 | Driggers ....................... | 361/692 |

OTHER PUBLICATIONS

Kuan et al., Power Engineering Journal, vol. 4, Issue 2, Mar. 1990, p. 79-86.*

* cited by examiner

*Primary Examiner* — Daniel Cavallari
(74) *Attorney, Agent, or Firm* — Fish & Richardson P.C.

(57) ABSTRACT

A data center includes an enclosure defining an interior space, a medium voltage power distribution system in the interior space, a plurality of transformers in the interior space, and a plurality of groups of racks in the interior space. The medium voltage power distribution system is electrically connected to a medium voltage power source outside the enclosure and includes a plurality of interconnected medium voltage power access units. Each transformer is electrically connected to an associated medium voltage power access unit and configured to step-down medium voltage power from the associated power access unit to low voltage power. Each rack includes a plurality of rack-mounted computers. Each group of racks is electrically connected to an associated transformer or to an adjacent rack or group of racks such that the associated transformer provides low voltage power to the group of racks.

20 Claims, 6 Drawing Sheets

US 8,994,231 B1

MEDIUM VOLTAGE POWER DISTRIBUTION

BACKGROUND

The following disclosure relates to a power distribution architecture for data centers.

Computers have become widely adopted for various applications, for both personal and corporate uses. Some computers operate as stand-alone data processing equipment, with perhaps a peripheral such as a printer and a display device. Although such stand-alone systems are useful for many purposes, additional features and benefits may be achieved if multiple computers are networked together to share information and resources.

The popularity and simplicity of sharing information over networks, such as the Internet, has resulted in demand for data processing and storage capacity to support high network traffic volumes. Computer data centers, facilities that house hundreds or thousands of computers that are networked together to provide various computer-based services, can help to meet this demand. In the context of the Internet, a data center may provide processing, storage, and support functions that improve performance or enhance the utility of the Internet. Data centers may also be deployed in other contexts. Financial institutions, for example, may employ one or more data centers to store financial account and transaction information.

A data center may provide data processing and storage capacity. In operation, a data center may be connected to a network, and may receive and respond to various requests from the network to retrieve, process, and/or store data. In addition to extensive data processing and data storage capabilities, data centers typically support high speed data transfer and routing capabilities. To meet future network demands, data center computing capacity may continue to increase.

SUMMARY

In one aspect, a data center includes an enclosure defining an interior space, a medium voltage power distribution system in the interior space, a plurality of transformers in the interior space; and a plurality of groups of racks in the interior space. The medium voltage power distribution system is electrically connected to a medium voltage power source outside the enclosure and includes a plurality of interconnected medium voltage power access units. Each transformer is electrically connected to an associated medium voltage power access unit from the plurality of medium voltage power access units and configured to step-down medium voltage power from the associated power access unit to low voltage power. Each rack includes a plurality of rack-mounted computers, and each group of racks is electrically connected to an associated transformer from the plurality of transformers or to an adjacent rack or group of racks such that the associated transformer provides low voltage power to the group of racks.

Implementations may include one or more of the following features. For example, the medium voltage power access units may be connected in series. The medium voltage power access units may be ring main units (RMU). Each group of racks may be separately electrically connected to the associated transformer. Power cables may provide electrical connection between the racks and transformers and may provide electrical connection between the medium voltage power access units.

The data center may include a power coordinator and power control nodes associated with the medium voltage power access units. The power coordinator and power control nodes may be configured to allocate computing tasks among the rack-mounted computers to limit an amount of power drawn through the medium voltage power access units or the transformers.

The medium voltage power access units may be arranged in one or more rows or in a mesh arrangement. The racks may be arranged in columns perpendicular to the one or more rows. Transformers connected to an associated medium voltage power access unit may be arranged in a column perpendicular to the one or more rows.

In another aspect, a method of assembling a power distribution network in a data center includes placing multiple medium voltage power access units within an enclosure defining an interior space; electrically connecting each of the power access units to another one of the power access units; electrically connecting at least one of the power access units to a medium voltage power source outside of the enclosure; placing a plurality of transformers within the interior space; and electrically connecting each transformer to an associated medium voltage power access unit from the plurality of medium voltage power access units. Each transformer is configured to step-down medium voltage power from the associated power access unit to low voltage power. The method further includes placing a plurality of groups of racks within the interior space, each rack including a plurality of rack-mounted computers; and electrically connecting each group of racks to an associated transformer from the plurality of transformers such that the associated transformer provides low voltage power to the group of racks.

Implementations may include one or more of the following features. For example, electrically connecting each of the power access units to another one of the power access units may include connecting the medium voltage power access units in series. The medium voltage power access units may be ring main units (RMU). Electrically connecting each group of racks to an associated transformer from the plurality of transformers may include electrically connecting each group of racks separately to the associated transformer. Power cables may provide electrical connection between the racks and transformers and may provide electrical connection between the medium voltage power access units.

The method may further include allocating computing tasks among the rack-mounted computers to limit an amount of power drawn through the medium voltage power access units or the transformers. Placing multiple medium voltage power access units within the enclosure may include placing the medium voltage power access units in one or more rows within the enclosure. Placing a plurality of groups of racks within the interior space may include placing the racks in columns perpendicular to the one or more rows. Placing a plurality of transformers within the interior space may include placing transformers connected to an associated medium voltage power access unit in a column perpendicular to the one or more rows.

The details of one or more implementations are set forth in the accompanying drawings and the description below. Other features and advantages will be apparent from the description and drawings, and from the claims.

DETAILED DESCRIPTION

In one implementation, power is brought into a data center at medium voltage (medium voltage power typically has a voltage in the range of between 1 kV and 50 kV, and most typically, between about 3 kV and 27 kV, for example, 15 kV). In particular, a medium voltage power strip is provided by a set of serially connected medium voltage switchboards (otherwise referred to as medium voltage access units, or MVAUs), which may be implemented using ring main units (RMU). Each MVAU provides one or more inlets and outlets for medium voltage power. One or more transformers (for example one to four transformers) are connected to each MVAU. Each transformer, for instance, may have a 0.5 MW capacity. A group of racks is connected to each transformer, with each rack having an individual power cord connection either directly to the transformer or to the adjacent rack or group of racks.

Figure 1:
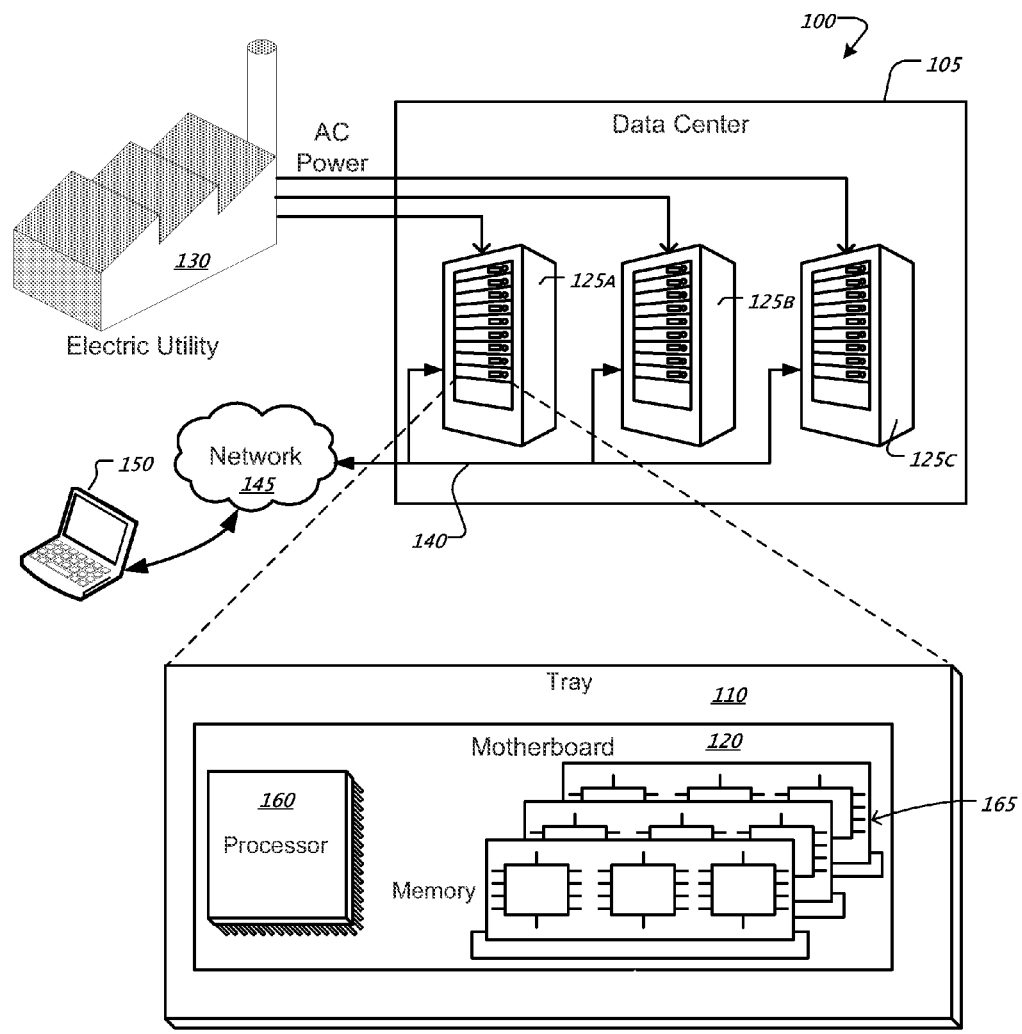
FIG. 1 is a schematic diagram illustrating an example of a data center.

FIG. 1 is a schematic diagram illustrating an example of a data center 105. In the depicted example, the data center 105 includes a number of racks 125A, 125B, 125C that contain a number of the trays 110. The racks 125A-125C may be powered by three phase AC power line voltages that are delivered to the data center 105 from an electric utility 130. The AC power line voltages delivered to each of the racks 125A-125C may originate from a rotating generator operated by the electric utility and driven by a steam or gas turbine, for example. The AC voltage signals, which are substantially sinusoidal, may be transmitted to a distribution point, such as a substation (not shown) in the utility grid, for example. The power line voltages may be distributed from the substation into the data center 105. In the data center 105, as described further below, this voltage may be stepped down (through one or multiple transformations and even rectified to DC voltage) and routed to the individual racks 125A-125C.

Unless otherwise indicated, references to AC voltages are understood to refer to substantially sinusoidal voltages, and voltage amplitudes are understood to refer to root mean square (RMS) values. The utility 130 may deliver substantially symmetric three phase voltages suitable for powering substantially balanced three phase loads.

Each of the trays 110 includes a motherboard 120 that holds one or more processors 160 and one or more memory units 165. Each tray 110 is coupled to a network connection 140. The network connection 140 provides an information channel to a network 145, which may include, for example, a local area network, virtual private network, wide area network (e.g., the Internet), or a combination of such networks, which may be wired, fiber optic, and/or wireless. A remote computer 150 represents one of many possible devices that could communicate data directly or indirectly with one or more trays to access, store, process, and/or retrieve information using a processor 160 and associated memory 165 on the motherboard 120. In some implementations, additional processors (e.g., servers) may facilitate such communication. For example, the exemplary remote computer device 150 may be included in a server, a desktop computer, a laptop computer, and/or a handheld processor-based device. One or more servers may pre- or post-process, supervise, route, and/or balance the flow of data associated with the communication.

In various implementations, the motherboard 120 may include one, two, three, four, or any other practicable number of processors 160. In some implementations, the motherboard 120 may be replaced with tray of data storage devices (e.g., hard disc drives, flash memory, RAM, or any of these or other types of memory in combination). In other implementations, the data storage devices can be integrated with the motherboard 120. In various implementations, a digital processor may include any combination of analog and/or digital logic circuits, which may be integrated or discrete, and may further include programmable and/or programmed devices that may execute instructions stored in a memory. The memory 165 may include volatile and/or non-volatile memory that may be read and/or written to by the processor 160. The motherboard 120 may further include some or all of a central processor unit(s) (CPU), memory (e.g., cache, non-volatile, flash), and/or disk drives, for example, along with various memories, chip sets, and associated support circuitry.

In some implementations, the motherboard 120 may provide one or more DC-to-DC converters to convert the DC bus voltage to a suitable voltage for operating the circuitry in the motherboard 120. For example, one or more DC-to-DC converters may provide regulated output voltages, which may include but are not limited to, for example a +3.3VDC power signal, a +5VDC power signal, a −5VDC power signal, a +12VDC power signal, and a −12VDC power signal.

The processor 160 and the memory 165 on the motherboard 120 may form at least a part of a processing system configured to handle network operations. As an illustrative example, the motherboard 120 may help to process Internet requests. The motherboard may process information either alone or in combination with other parallel processes running on other processor-based devices, such as one or more other trays 110 in the data center 105.

Figure 2:
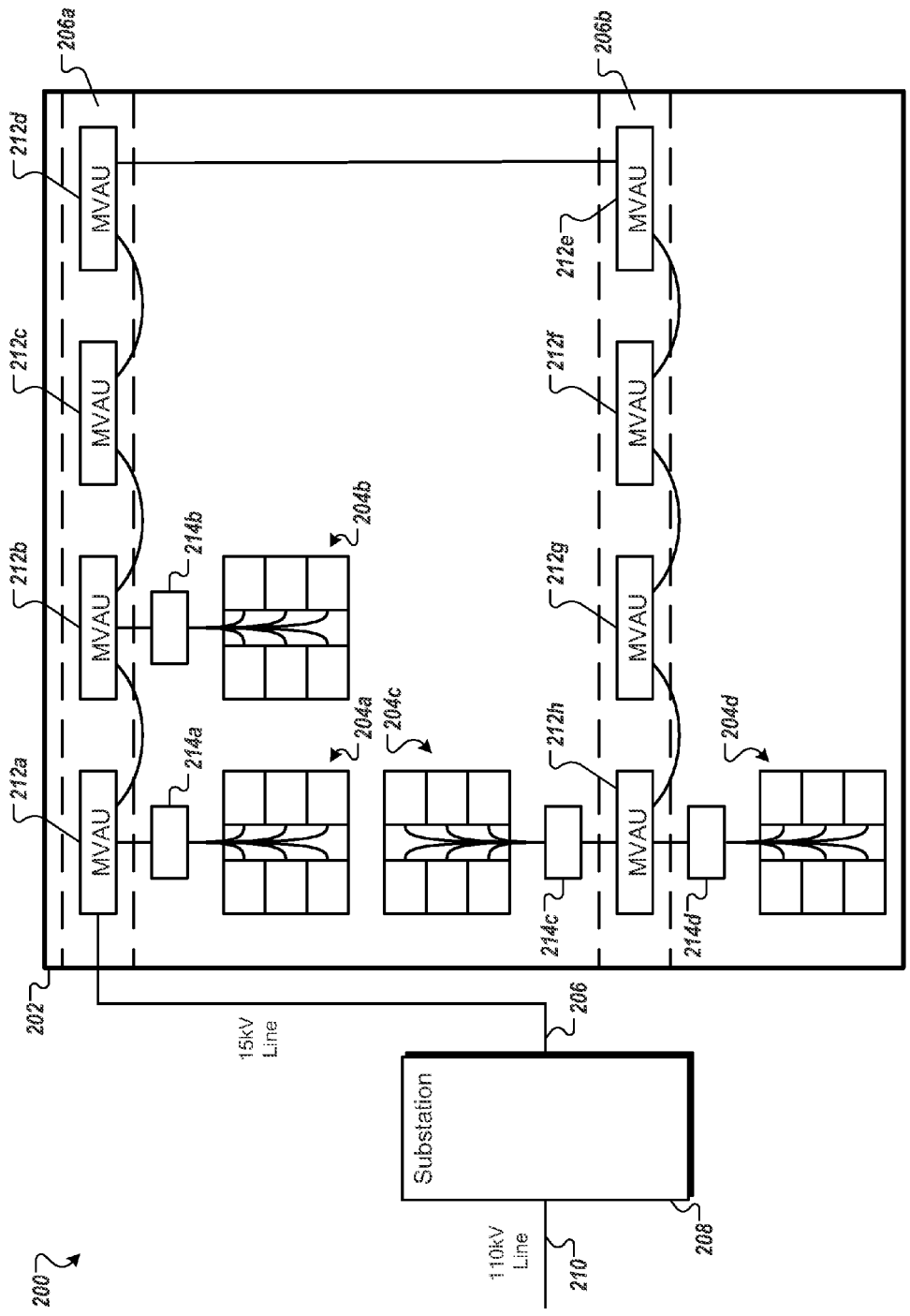
FIG. 2 is a schematic diagram illustrating an example of a power distribution layout in a data center.

FIG. 2 is a schematic diagram illustrating an example of a power distribution layout 200 in a data center 202. In some implementations, the data center 202 may be the data center 105 of FIG. 1. The data center 202 includes a number of computer rack groups 204a-204d that consume electrical power. Medium voltage electrical power is distributed through the data center 202 through a collection of medium voltage aisles 206a-206b for localized supply of power to the computer rack groups 204a-204d. Medium voltage electrical power is generally used for distribution of electrical power (as opposed to transmission, which uses higher voltages) and often delivered to primary electricity customers.

The medium voltage aisles 206a-206b draw power from a medium voltage line 206, which is supplied with power from a substation 208 that steps down power from a high voltage (e.g., 110 kV or higher) power transmission line 210 down to medium voltage (through one or multiple transformations). In some implementations, the medium voltage aisles 206a-206b may be connected to multiple medium power lines 206 so that the power capacity can be shared across the data center 202.

The medium voltage aisles 206a-206b include rows of serially connected power access units 212a-212h, otherwise referred to as medium voltage access units (MVAU). In some implementations, the power access units 212a-212h may be ring main units (RMUs). Generally speaking, a medium voltage access unit can be used to distribute medium voltage. A medium voltage access unit includes a power input, a power output, and a tee-off that can be connected to a transformer to access the power. The power not tapped through the tee-off is passed out the power output. A medium voltage access unit may be a prefabricated assembly or assembled from several individual medium voltage switching devices and control accessories.

Each power access unit 212a-212e provides a number of medium voltage tee-offs. A transformer can be connected to a given medium voltage tap. For example, the transformer 214a draws power from the power access unit 212a, the transformer 214b draws power form the power access unit 212b, and the transformers 214c and 214d draw power from the power access unit 212h. In various implementations, zero, one, two, three, four, or more transformers may be configured to draw power from each of the power access units 212a-212h.

The transformers 214a-214d step down the medium voltage power to low voltage power (e.g., 110/220V). Low voltage power is typically provided to secondary electricity customers. Low voltage power typically has a voltage below 1 kV, and normally around 110V or 230V. Low voltage power is used by most consumers and, therefore, most consumer electronics are designed to use low voltage power.

The stepped-down (to low voltage) power can be used to power the computer rack groups 204a-204d. For instance, each rack may be separately connected to an associated transformer by conductive cables. In some implementations, the transformers 214a-214d may have an approximately 0.5 MW capacity and each rack may draw a maximum of about 20 kW of power. In some implementations, the power cables between the power access units 212a-212d, and from the power access units 212a-212d to the transformers 214a-214d, may be run through a grate-covered trough in a concrete floor. In some implementations, power cables between the transformers 214a-214d and the racks 204a-204d may be run similarly through troughs or through overhead trays.

As shown, the power access units 212a-212e may be arranged with the power output of one unit being connected to the power input of the next unit. In this case, each of the power access units 212a-212e may draw the amount of power needed to supply the transformers 214a-214d connected to that unit, and pass the unused power to the next serially connected power access unit. For example, the power access unit 212b draws power from the power unit 212a, provides power to the transformer 214b, and passes the remaining power on to the power access unit 212c.

In some implementations, the power access units 212a-212h may include switches on both sides of the tee-off, one to open the ring and another at the connection to the distribution transformer. In various configurations, the connection to the transformer may include, for example, a separate switch and fuse, a combined switch and fuse (a fused switch), or a circuit breaker. In some configurations, the earthing switch may also be integrated into the power access units 212a-212h.

In some implementations, the use of power access units can increase the configurability of the data center 202. For example, if more power is required in a particular area of the data center 202 due to installation or upgrade of servers, an additional transformer can be connected to the nearest power access unit. In some implementations, the power access units 212a-212h and/or the transformers 214a-214d may be available as manufactured, integrated packages, thereby possibly foregoing costs associated with specifying and selecting individual power distribution components and the labor to have those components assembled and installed in customized configurations.

In some implementations, the power access units 212a-212h, the transformers 214a-214d, and the like may be small enough to be brought easily into the data center 202. The transformers 214a-214d can be located near or substantially adjacent to the computer rack groups 204a-204d. For example, the transformers 214a-214d may be housed in an enclosure that has substantially the same dimensions as a computer rack, or to form an end-cap that is substantially the width of a computer rack group, to substantially minimize the distances needed to distribute low-voltage power from the transformers 214a-214d to the computer rack groups 204a-204d. The computer rack groups 204a-204d and/or the transformers 214a-214d may, in some implementations, be arranged in columns oriented substantially perpendicular to the medium power aisles 206a-206b. For instance, as shown in FIG. 2, MVAUs 212a-212d are arranged in a first line forming a first aisle 206a and MVAUs 212h-212e are arranged in a second line forming a second aisle 206b. Transformers 214a, 214c, and 214d are arranged, with rack groups 204a, 204c, and 204d, in a line to form a column that is perpendicular to the first and second aisles 206a, 206b.

In some implementations, a cost savings may be realized when medium voltages, rather than low voltages, are distributed through the data center 202 at the same total power. In the example of the data center 202, instead of transforming power to low voltage (e.g., generally in a number of transformers located outside of the data center 202) and distributing low voltage power throughout the data center 202, medium voltage power is distributed through the data center 202 and stepped down close to its point of use (e.g., the computer rack groups 204a-204d).

Electrical current and voltage are interchangeable through transformation, and since the same amount of electrical power can be distributed more cost effectively at higher voltages at lower amperages than can be done with lower voltage and higher amperage power, there may be a cost savings to be realized by reducing the lengths of high-amperage conductors. For example, the distribution of low voltage power may require the use of busbars, which can be costly both in terms of materials (e.g., thick slabs of copper or aluminum) and labor (e.g., qualified electricians are generally needed to install busbar circuits, busbars are generally installed as solid strips in overhead conduits).

By contrast, the same amount of power may be distributed at lower amperages and higher voltages, thereby reducing the cost associated with power distribution. For example, lower amperages can be distributed through thinner conductors than high amperages can. As such, the use of thick busbars may be replaced by the use of thinner (e.g., less expensive), possibly flexible, conductive cables or wires. In some implementations, the use of flexible conductive cabling or wires may reduce the cost to configure or reconfigure the data center 202. For example, when configuring or expanding a data center, the cost associated with installing overhead busbars may be eliminated by replacing the busbars with cabling that can be run overhead or under a false floor. In an example of reconfiguring the data center 202, the transformers 214a-214d and the computer rack groups 204a-204d can be moved to different locations within the data center 202 without having to incur the expense of re-mounting the busbars. Instead, flexible conductive cables may simply be run to the new locations of the transformers 214a-214d and between the various components, such as the power access units and racks.

In some implementations, the use of flexible conductive cables instead of busbars may provide a cost savings for even more basic maintenance operations. For example, connection or disconnection of a busbar may call for the skills and labor expense of a qualified electrician, while cables may be safely plugged and unplugged by data center technicians without requiring any special electrical knowledge or equipment.

Since the individual computer rack groups 204a-204d are connected directly to the transformers 214a-214d, standard heavy duty power cabling can be used rather than expensive specialized busbars. Cabling connections between the components can be set up by non-specialists, and the entire installation process for the busbars may be eliminated.

In some implementations, the use of power access units can increase the efficiency of electrical power use. For example, unused capacity at one power access unit can be shunted to other power access units. Effectively, the entire power available from the medium voltage line 206 (e.g., 10 MW) can be made available within the data center 202 rather than being divided into blocks, such as in distribution arrangements that divide 10 MW of available power from a power utility between five power module centers, each of which has 2 MW capacity.

In some implementations, power economy may be 90% of power usage (e.g., reserving 10% for sudden load spikes) since unused power from one power access unit can be passed on to the next unit. In some implementations, capital equipment costs may be reduced through the implementation of the power access units 212a-212h and the transformers 214a-214d.

Figure 3:
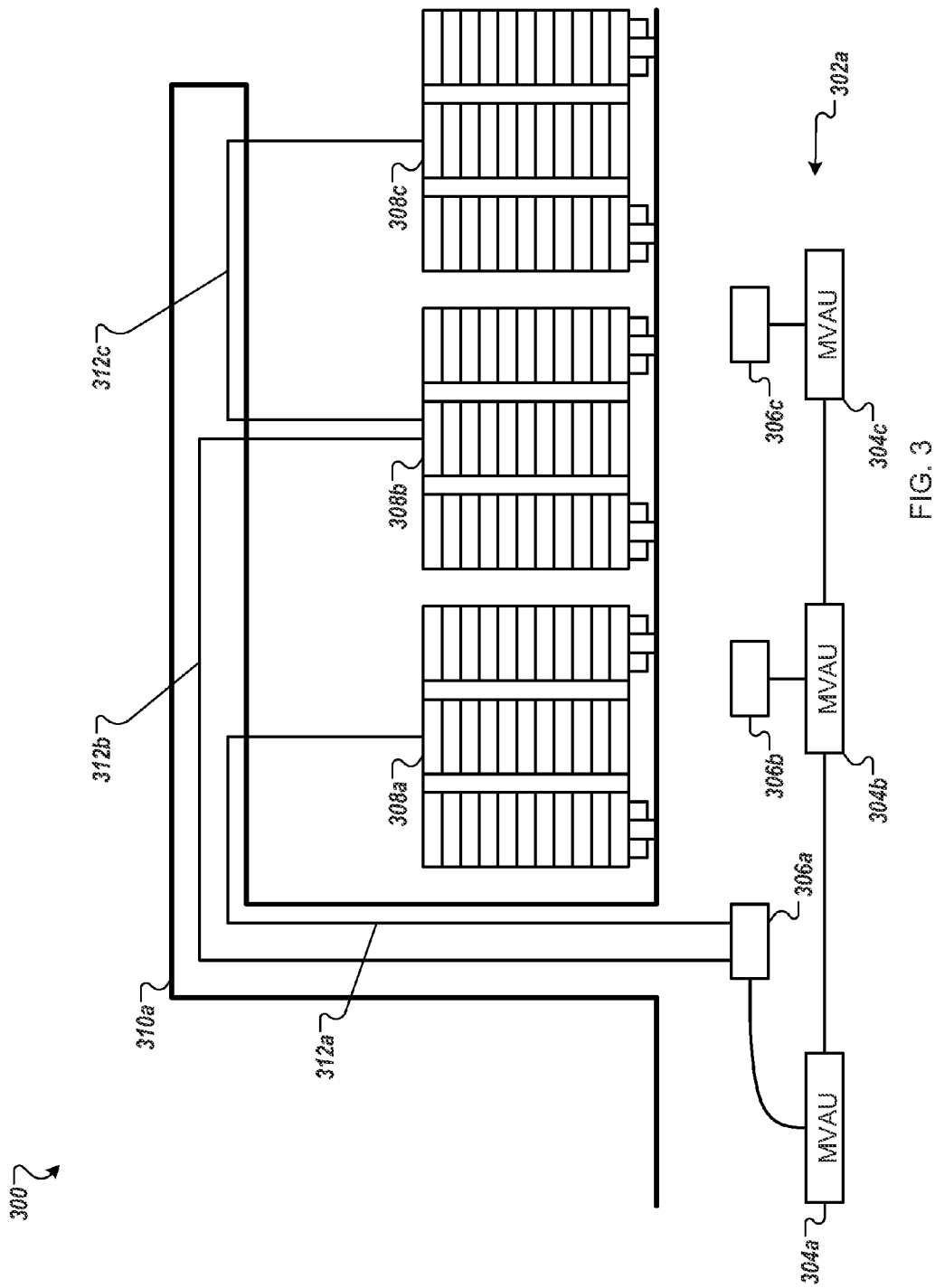
FIG. 3 is an illustration showing an example of a power distribution system in a data center.

FIG. 3 is an illustration showing an example of a power distribution system 300 in a data center, such as the data center 202 of FIG. 2. A medium voltage aisle 302a includes a number of medium voltage power access units 304a-304c (e.g., RMUs) and associated cabling arranged in a grate-covered trough in a concrete floor 312. A number of transformers 306a-306c are connected to respective power access units 304a-304c by associated medium voltage (MV) cables and placed in the trough. While FIG. 3 illustrates a single transformer 304a-304c connected to a respective one of the MVAUs 306a-306c, in various implementations more than one transformer may be connected to a given transformer (as illustrated, for example, by transformers 214c, 214d and MVAU 212h in FIG. 2). Alternative methods for installing MV cables include installations at or above the rack level.

Power from the power access units 304a-304c is conducted to a number of computer rack groups 308a-308c by a group of conductive cables 312a-312c. The conductive cables 312a-312c are routed though conduits and/or overhead trays 310a-310c. In some implementations, each rack in one of the computer rack groups 308a-308b may be individually connected by conductive cables to an associated one of the transformers (for example 306a) and some racks (such as 308c) may be connected to an adjacent rack (308b), as shown in FIG. 3.

Figure 4:
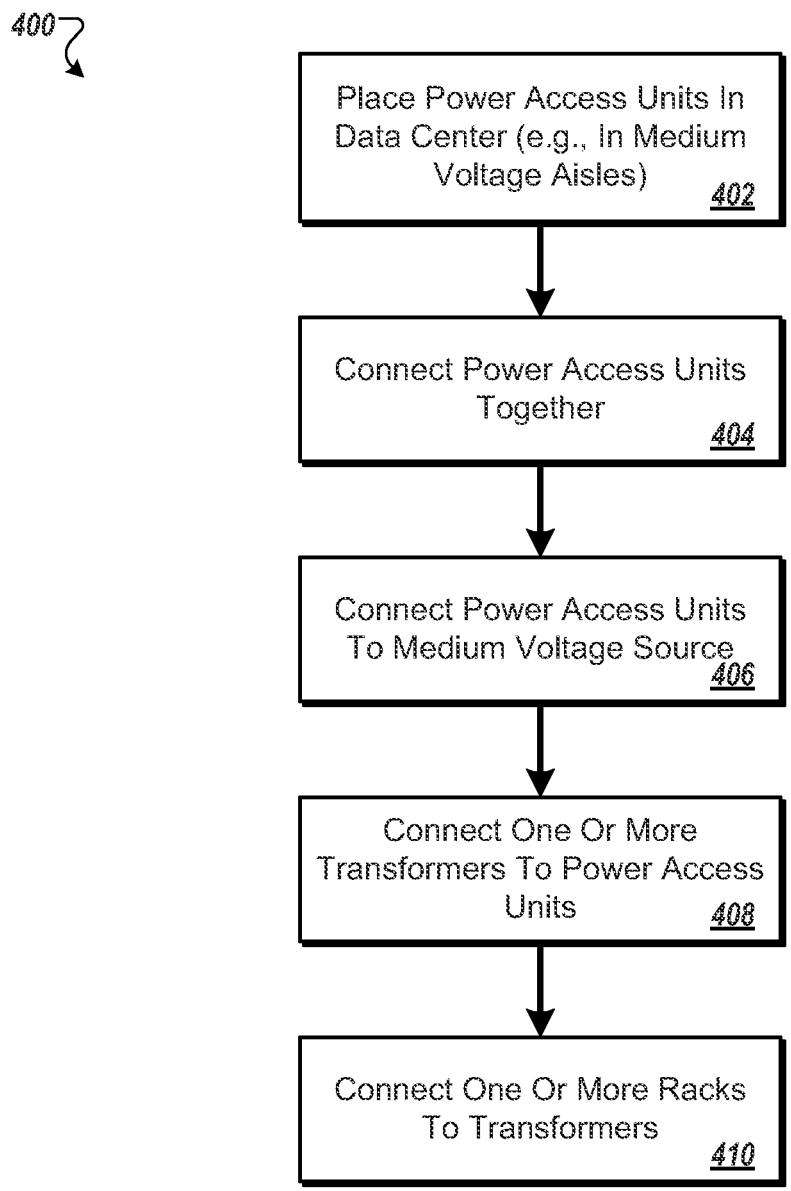
FIG. 4 is a flowchart showing an example of a process for assembling a power distribution system and computing nodes in a data center.

FIG. 4 is a flowchart showing an example of a process 400 for assembling a power distribution system and computing nodes in a data center such as the data center 202 of FIG. 2. The process 400 starts when power access units are placed (402) in the data center. For example, the power access units 212a-212h are arranged in the medium voltage aisles 206a-206b.

The power access units are then connected (404) together, and the power access units are then connected (406) to a medium voltage source. For example, the power access units 212a-212h are serially connected to each other by connecting the power outputs of a unit, e.g., a first power unit 212a, to the power inputs of another unit, e.g., a second power unit 212b, and then the power input of the power access unit 212a, e.g., the first power unit 212a, is connected to the medium voltage line 206. In some implementations, more than one of the power access units 212a-212h may be connected to a medium voltage source, such as a second medium voltage line from the substation 208 or another substation (not shown). For example, the power access unit 212h may be connected to a second medium voltage line provided by the substation 208 to form a ring main.

One or more transformers are connected (408) to the power access units. For example, the transformers 214c and 214d are connected to the power access unit 212h. One or more racks are then connected (410) to the transformers, such as in the example of FIG. 2 where the racks in the computer rack group 204d are connected to the transformer 214d.

Figure 5:
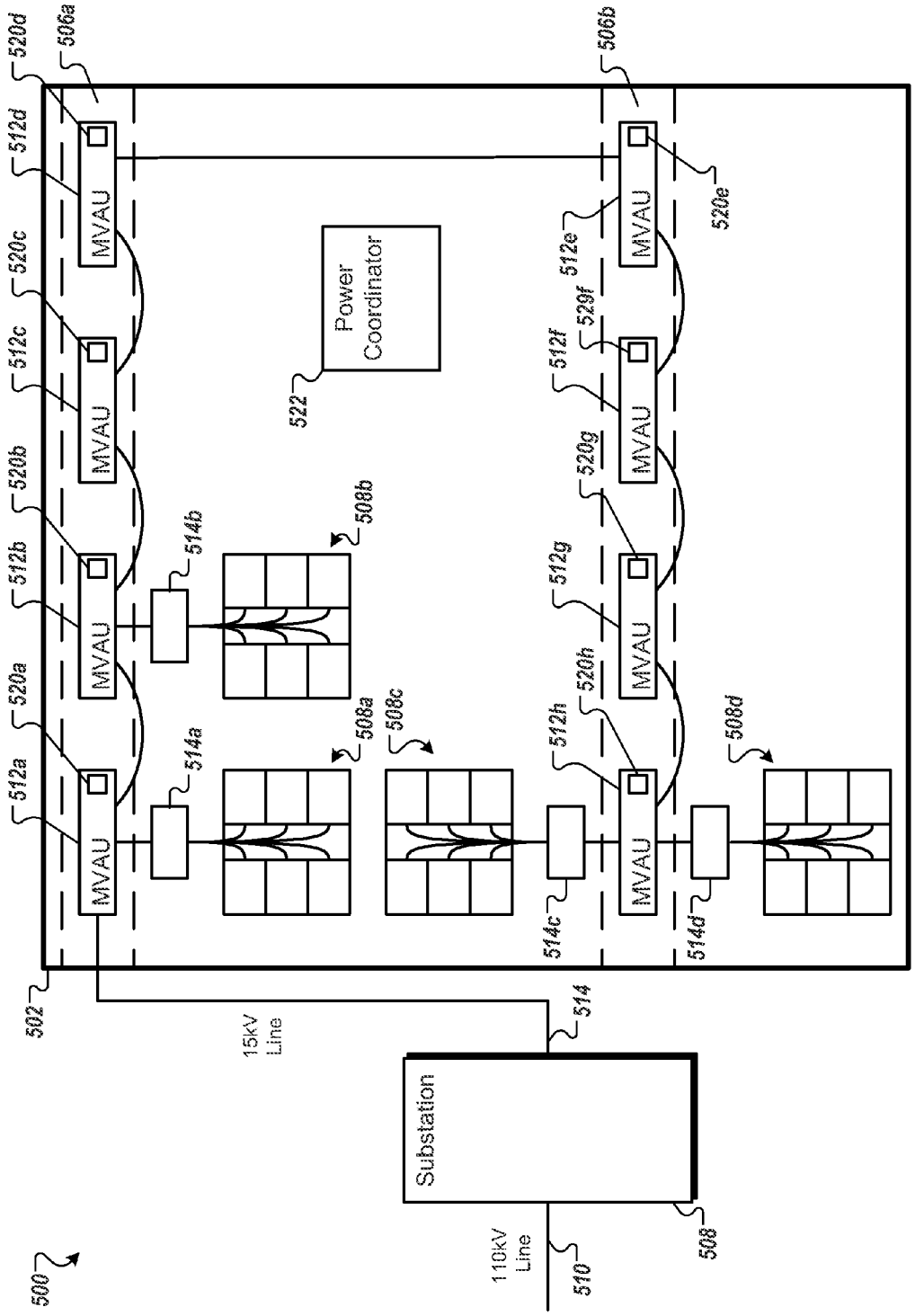
FIG. 5 is a schematic diagram illustrating another example of a power distribution layout in a data center.

FIG. 5 is a schematic diagram illustrating another example of a power distribution layout 500 in a data center 502. The data center 502 is substantially similar to the data center 202, with the addition of a number of power control nodes 520a-520h and a power coordinator 522, which will be discussed later.

The data center 502 obtains electrical power from a high voltage line 510 that is stepped down to medium voltage at a substation 508. The medium voltage power is conducted to the data center 502 by a medium voltage line 514. Medium voltage power is distributed through the data center 502 through a number of power access units 512a-512h that are serially interconnected and arranged in rows that form a medium voltage aisle 506a and 506b. Each of the power access units 512a-512h provides power to one or more of a collection of transformers 514a-514d, which transform the distributed medium voltage power into low voltage power. Racks of computers arranged in a number of computer rack groups 508a-508d are connected to the transformers 514a-514d to obtain low voltage power.

Each of the power access units 512a-512h includes one of the power control nodes 520a-520h. The power control nodes 520a-520h provide circuitry and logic that give the power access units 512a-512h an ability to limit or cut off power to their respectively connected transformers 514a-514d and/or to their neighboring, serially connected power access units 512a-512h. The power coordinator 522 is communicatively connected to the power control nodes 520a-520h to coordinate, and potentially control, the power usage among the computer rack groups 508a-508d. In addition, the power coordinator 522 may be coupled to the computers in the rack groups 508a-508d to obtain information about the power being drawn by the racks 508a-508d and/or allocate computing tasks among the computers in the rack groups 508a-508d. For example, in some implementations, the power coordinator 522 may process information that describes the amount of power being drawn by the rack groups 508a-508d and coordinate with the power control nodes 520a-520h to ensure that the amount of power drawn does not exceed the power ratings of the transformers 514a-514d and/or the power access units 512a-512h. In some implementations, the power coordinator 522 may allocate computing tasks among the computers in the computer rack groups 508a-508d to limit the amount of power drawn through the transformers 514a-514d and/or the power access units 512a-512h, as will be described next.

Figure 6:
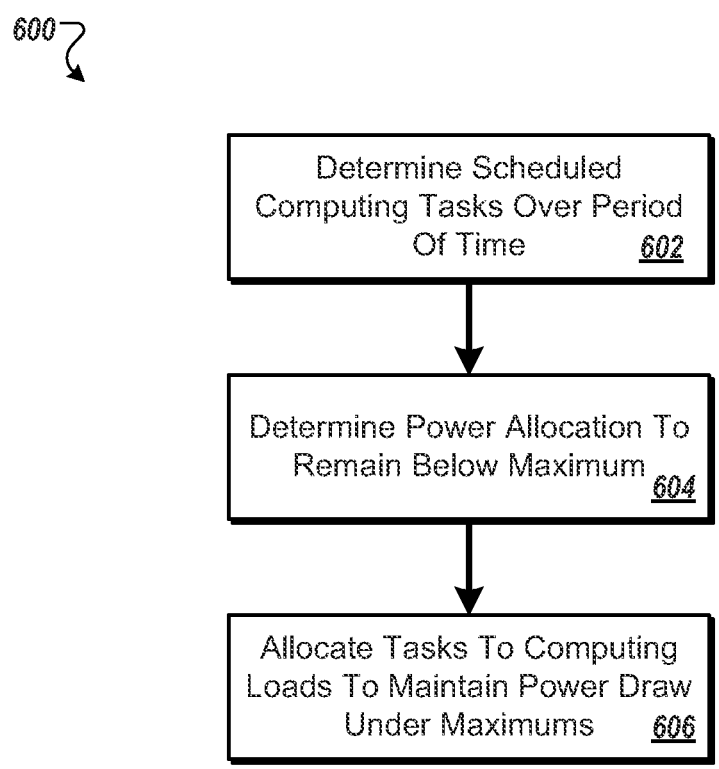
FIG. 6 is a flowchart showing a process for allocating computing resources.

FIG. 6 is a flowchart showing a process 600 for allocating computing resources to ensure that the limits of the transformers or power access units are not exceeded or to otherwise distribute the power used across the data center. In some implementations, the process 600 may be used by the power coordinator 522 and the power control nodes 520a-520h.

Generally speaking, the amount of power that flows through the medium voltage distribution system can be managed by selectively allocating computing tasks among computers, since the amount of power a computer draws can be influenced by the amount of information the computer is tasked with processing. For example, the power consumed by a rack of computers may be reduced by controllably reallocating some of the rack's computing load to other computers outside of the rack. In another example, the power consumed by a rack of computers may be reduced by controllably throttling (e.g., reducing) the speed at which the computers in the rack are able to process their computing loads.

The process 600 begins by determining (602) the scheduled computing tasks over a period of time. For example, the power coordinator may have access to scheduling information that describes anticipated computing loads that will need to be processed over the next minute, hour, day, or other length of time.

A determination (604) of the power allocation that is needed to make the power allocation remain below a maximum setpoint is then made. For example, a power allocation may be determined (604) to prevent more than 0.5 MW of power from being drawn from a transformer with a 0.5 MW rating and/or to prevent a rack from drawing more than its maximum rated power (e.g., 20 kW). Similarly, a power allocation may be determined (604) to prevent more than 30 MW from being drawn from a 30 MW medium voltage source.

Tasks are then allocated (606) to computing loads to maintain the determined (604) power draw and amount of power that is under the maximum power draw setpoint. For example, the computer rack group 508a may collectively have some tasks reassigned to computers in the other computer rack groups 508b-508d to prevent the computer rack group 508a from collectively drawing more than the determined (604) amount of power.

Although exemplary implementations have been described with reference to the figures, other implementations are possible. For example, while the power access units have been illustrated as arranged in rows, the power access units may be arranged in a mesh arrangement wherein some of the power access units may be connected in columns in addition to rows. For example, referring to FIG. 2, an additional MVAU may be connected in between MVAU 212c and 212f thereby providing a column of MVAUs as well as rows.

A number of implementations have been described. Nevertheless, it will be understood that various modifications may be made without departing from the spirit and scope. For example, advantageous results may be achieved if the steps of the disclosed techniques were performed in a different sequence, if components in the disclosed systems were combined in a different manner, or if the components were replaced or supplemented by other components. The functions and processes (including algorithms) may be performed in hardware, software, or a combination thereof, and some implementations may be performed on modules or hardware not identical to those described. Accordingly, other implementations are within the scope of the following claims.

What is claimed is:

1. A data center, comprising:
an enclosure defining an interior space;
a medium voltage power distribution system in the interior space and electrically connected to a medium voltage power source outside the enclosure, the medium voltage power distribution system including a plurality of interconnected medium voltage power access units, wherein the medium voltage power source provides power at a voltage greater than 1 kV and less than 50 kV;
a plurality of transformers in the interior space, each transformer electrically connected to an associated medium voltage power access unit from the plurality of medium voltage power access units and each transformer configured to step-down medium voltage power from the associated power access unit to low voltage power less than 1 kV; and
a plurality of groups of racks in the interior space, each rack including a plurality of rack-mounted computers, and each group of racks electrically connected to an associated transformer from the plurality of transformers or to an adjacent rack or group of racks such that the associated transformer provides low voltage power to the group of racks.

2. The data center of claim 1, wherein the medium voltage power access units are connected in series.

3. The data center of claim 1, wherein the medium voltage power access units are ring main units (RMU).

4. The data center of claim 1, wherein each group of racks is separately electrically connected to the associated transformer.

5. The data center of claim 4, wherein power cables provide electrical connection between the racks and transformers.

6. The data center of claim 5, wherein power cables provide electrical connection between the medium voltage power access units.

7. The data center of claim 1, further comprising a power coordinator and power control nodes associated with the medium voltage power access units, wherein the power coordinator and power control nodes are configured to allocate computing tasks among the rack-mounted computers to limit an amount of power drawn through the medium voltage power access units or the transformers.

8. The data center of claim 1, wherein the medium voltage power access units are arranged in one or more rows or in a mesh arrangement.

9. The data center of claim 8, wherein the medium voltage power access units are arranged in one or more rows and the racks are arranged in columns perpendicular to the one or more rows.

10. The data center of claim 9, wherein transformers connected to an associated medium voltage power access unit are arranged in a column perpendicular to the one or more rows.

11. A method of assembling a power distribution network in a data center, the method comprising:
placing multiple medium voltage power access units within an enclosure defining an interior space;
electrically connecting each of the power access units to another one of the power access units;
electrically connecting at least one of the power access units to a medium voltage power source outside of the enclosure, the medium voltage power source providing power at a voltage greater than 1 kV and less than 50 kV;
placing a plurality of transformers within the interior space;
electrically connecting each transformer to an associated medium voltage power access unit from the plurality of medium voltage power access units, wherein each transformer is configured to step-down medium voltage power from the associated power access unit to low voltage power less than 1 kV;
placing a plurality of groups of racks within the interior space, each rack including a plurality of rack-mounted computers; and
electrically connecting each group of racks to an associated transformer from the plurality of transformers such that the associated transformer provides low voltage power to the group of racks.

12. The method of claim 11, wherein electrically connecting each of the power access units to another one of the power access units comprises connecting the medium voltage power access units in series and/or in parallel.

13. The method of claim 11, wherein the medium voltage power access units are prefabricated or on site assembled medium voltage switchboards comprising of one or more breakers or fused switches.

14. The method of claim 11, wherein electrically connecting each group of racks to an associated transformer from the plurality of transformers comprises electrically connecting each group of racks separately to the associated transformer.

15. The method of claim 14, wherein power cables provide electrical connection between the group of racks and transformers.

16. The method of claim 15, wherein power cables provide electrical connection between the medium voltage power access units.

17. The method of claim 11, further comprising allocating computing tasks among the rack-mounted computers to limit an amount of power drawn through the medium voltage power access units or the transformers.

18. The method of claim 11, wherein placing multiple medium voltage power access units within the enclosure comprises placing the medium voltage power access units in one or more rows within the enclosure.

19. The method of claim 18, wherein placing a plurality of groups of racks within the interior space comprises placing the racks in columns perpendicular to the one or more rows.

20. The method of claim 19, wherein placing a plurality of transformers within the interior space comprises placing transformers connected to an associated medium voltage power access unit in a column perpendicular to the one or more rows.

* * * * *